(12) United States Patent
Simsek-Ege et al.

(10) Patent No.: US 12,341,134 B2
(45) Date of Patent: Jun. 24, 2025

(54) MICROELECTRONIC DEVICES, AND METHODS OF FORMING MICROELECTRONIC DEVICES

(71) Applicant: Micron Technology, Inc., Boise, ID (US)

(72) Inventors: Fatma Arzum Simsek-Ege, Boise, ID (US); Yuan He, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 18/478,821

(22) Filed: Sep. 29, 2023

(65) Prior Publication Data

US 2024/0038730 A1     Feb. 1, 2024

Related U.S. Application Data

(62) Division of application No. 17/344,444, filed on Jun. 10, 2021, now Pat. No. 11,810,901.

(51) Int. Cl.
*H01L 25/065*    (2023.01)
*H01L 25/00*     (2006.01)
(Continued)

(52) U.S. Cl.
CPC .......... *H01L 25/0657* (2013.01); *H01L 25/18* (2013.01); *H01L 25/50* (2013.01);
(Continued)

(58) Field of Classification Search
CPC ..... H01L 25/0657; H01L 25/18; H01L 25/50; H01L 24/32; H01L 27/1207;
(Continued)

(56) References Cited

U.S. PATENT DOCUMENTS 8,067,286 B2    11/2011    Parekh et al.
8,153,499 B2     4/2012    Or-Bach et al.
(Continued)

FOREIGN PATENT DOCUMENTS

CN    109887920 A    6/2019
TW    201203539 A    1/2012
TW    202040800 A    11/2020

OTHER PUBLICATIONS

Taiwanese Search Report and Office Action from Taiwanese Application No. 111121381, dated Jul. 27, 2023, 8 pages with English translation.

(Continued)

*Primary Examiner* — Thanh Y. Tran
(74) *Attorney, Agent, or Firm* — TraskBritt

(57) ABSTRACT

A microelectronic device comprises a first control logic region comprising first control logic devices and a memory array region vertically overlying the first control logic region. The memory array region comprises capacitors, access devices laterally neighboring and in electrical communication with the capacitors, conductive lines operatively associated with the access devices and extending in a lateral direction, and first conductive pillars operatively associated with the access devices and vertically extending through the memory array region. The microelectronic device further comprises a second control logic region comprising second control logic devices vertically overlying the memory array region. Related microelectronic devices, memory devices, electronic systems, and methods are also described.

12 Claims, 7 Drawing Sheets

(51) Int. Cl.
  *H01L 25/18* (2023.01)
  *H01L 23/00* (2006.01)
  *H10B 12/00* (2023.01)
  *H10D 87/00* (2025.01)

(52) U.S. Cl.
  CPC .... *H01L 24/32* (2013.01); *H01L 2224/32145* (2013.01); *H01L 2924/1431* (2013.01); *H01L 2924/1436* (2013.01); *H10B 12/50* (2023.02); *H10D 87/00* (2025.01)

(58) Field of Classification Search
  CPC ... H01L 2224/32145; H01L 2924/1431; H01L 2924/1436; H01L 24/29; H01L 27/0688; H01L 2224/83896; H10B 12/50
  See application file for complete search history.

(56) References Cited

U.S. PATENT DOCUMENTS

| | | | |
|---|---|---|---|
| 8,184,471 B2 | 5/2012 | Woo et al. | |
| 8,546,188 B2 | 10/2013 | Liu et al. | |
| 8,716,116 B2 | 5/2014 | Parekh et al. | |
| 9,543,433 B2 | 1/2017 | Anathan et al. | |
| 10,665,580 B1 | 5/2020 | Hosoda et al. | |
| 2009/0325343 A1 | 12/2009 | Lee | |
| 2010/0301926 A1 | 12/2010 | Dell et al. | |
| 2014/0254231 A1 | 9/2014 | Cernea et al. | |
| 2014/0308789 A1 | 10/2014 | Kai et al. | |
| 2019/0024493 A1 | 1/2019 | Johnson et al. | |
| 2019/0074277 A1 | 3/2019 | Ramaswamy | |
| 2019/0081069 A1 | 3/2019 | Lu et al. | |
| 2019/0244933 A1 | 8/2019 | Or-Bach et al. | |
| 2020/0066730 A1 | 2/2020 | Guo et al. | |
| 2020/0105721 A1 | 4/2020 | Park | |
| 2020/0111793 A1 | 4/2020 | Kim et al. | |
| 2020/0258876 A1 | 8/2020 | Hosoda et al. | |
| 2020/0279601 A1 | 9/2020 | Kim et al. | |
| 2020/0328180 A1 | 10/2020 | Cheng et al. | |
| 2020/0381046 A1 | 12/2020 | Redaelli et al. | |
| 2020/0411078 A1 | 12/2020 | Sharma et al. | |
| 2021/0217730 A1 | 7/2021 | Parekh et al. | |
| 2021/0375790 A1 | 12/2021 | Oda et al. | |
| 2021/0398945 A1 | 12/2021 | Parekh | |
| 2021/0407980 A1 | 12/2021 | Young et al. | |
| 2021/0408033 A1 | 12/2021 | Baraskar et al. | |
| 2022/0068859 A1 | 3/2022 | Choi et al. | |
| 2022/0102334 A1 | 3/2022 | Kim et al. | |
| 2022/0130846 A1 | 4/2022 | Kim et al. | |
| 2022/0187365 A1 | 6/2022 | Song et al. | |
| 2022/0189984 A1 | 6/2022 | Okina | |
| 2022/0208748 A1 | 6/2022 | Rabkin et al. | |
| 2022/0223525 A1 | 7/2022 | Hwang et al. | |
| 2022/0246562 A1 | 8/2022 | Hou et al. | |
| 2022/0285233 A1 | 9/2022 | Li et al. | |
| 2022/0352104 A1 | 11/2022 | Hou et al. | |
| 2022/0359441 A1* | 11/2022 | Hasnat | H10B 43/40 |
| 2022/0359555 A1 | 11/2022 | Toyama et al. | |
| 2022/0367393 A1 | 11/2022 | Shao et al. | |

OTHER PUBLICATIONS

International Search Report for International Application No. PCT/US2022/030190, mailed Sep. 15, 2022, 2 pages.
International Written Opinion for International Application No. PCT/US2022/030190, mailed Sep. 15, 2022, 4 pages.
Taiwanese Second Office Action from Taiwanese Application No. 111121381, dated Apr. 18, 2024, 5 pages with English translation.
Taiwanese Search Report and Notice of Allowance from Taiwanese Application No. 113144202, dated Apr. 21, 2025, 16 pages with English translation.

* cited by examiner

MICROELECTRONIC DEVICES, AND METHODS OF FORMING MICROELECTRONIC DEVICES

CROSS-REFERENCE TO RELATED APPLICATION

This application is a divisional of U.S. patent application Ser. No. 17/344,444, filed Jun. 10, 2021, now U.S. Pat. No. 11,810,901, issued Nov. 7, 2023, the disclosure of which is hereby incorporated herein in its entirety by this reference.

TECHNICAL FIELD

The disclosure, in various embodiments, relates generally to the field of microelectronic device design and fabrication. More specifically, the disclosure relates to methods of forming microelectronic devices including microelectronic device structures each including control logic regions, and to related microelectronic devices, memory devices, and electronic systems.

BACKGROUND

Microelectronic device designers often desire to increase the level of integration or density of features within a microelectronic device by reducing the dimensions of the individual features and by reducing the separation distance between neighboring features. In addition, microelectronic device designers often desire to design architectures that are not only compact, but offer performance advantages, as well as simplified designs.

One example of a microelectronic device is a memory device. Memory devices are generally provided as internal integrated circuits in computers or other electronic devices. There are many types of memory devices including, but not limited to, volatile memory devices, such as dynamic random-access memory (DRAM) devices; and non-volatile memory devices such as NAND Flash memory devices. A typical memory cell of a DRAM device includes one access device, such as a transistor, and one memory storage structure, such as a capacitor. Modern applications for semiconductor devices can employ significant quantities of memory cells, arranged in memory arrays exhibiting rows and columns of the memory cells. The memory cells may be electrically accessed through digit lines (e.g., bit lines, data lines) and word lines (e.g., access lines) arranged along the rows and columns of the memory cells of the memory arrays. Memory arrays can be two-dimensional (2D) so as to exhibit a single deck (e.g., a single tier, a single level) of the memory cells, or can be three-dimensional (3D) so as to exhibit multiple decks (e.g., multiple levels, multiple tiers) of the memory cells.

Control logic devices within a base control logic structure underlying a memory array of a memory device have been used to control operations (e.g., access operations, read operations, write operations) of the memory cells of the memory device. An assembly of the control logic devices may be provided in electrical communication with the memory cells of the memory array by way of routing and interconnect structures. However, processing conditions (e.g., temperatures, pressures, materials) for the formation of the memory array over the base control logic structure can limit the configurations and performance of the control logic devices within the base control logic structure. In addition, the quantities, dimensions, and arrangements of the different control logic devices employed within the base control logic structure can also undesirably impede reductions to the size (e.g., horizontal footprint) of the memory device, and/or improvements in the performance (e.g., faster memory cell ON/OFF speed, lower threshold switching voltage requirements, faster data transfer rates, lower power consumption) of the memory device. Furthermore, as the density and complexity of the memory array have increased, so has the complexity of the control logic devices. In some instances, the control logic devices consume more real estate than the memory devices, reducing the memory density of the memory device.

DETAILED DESCRIPTION

Figure 1A:
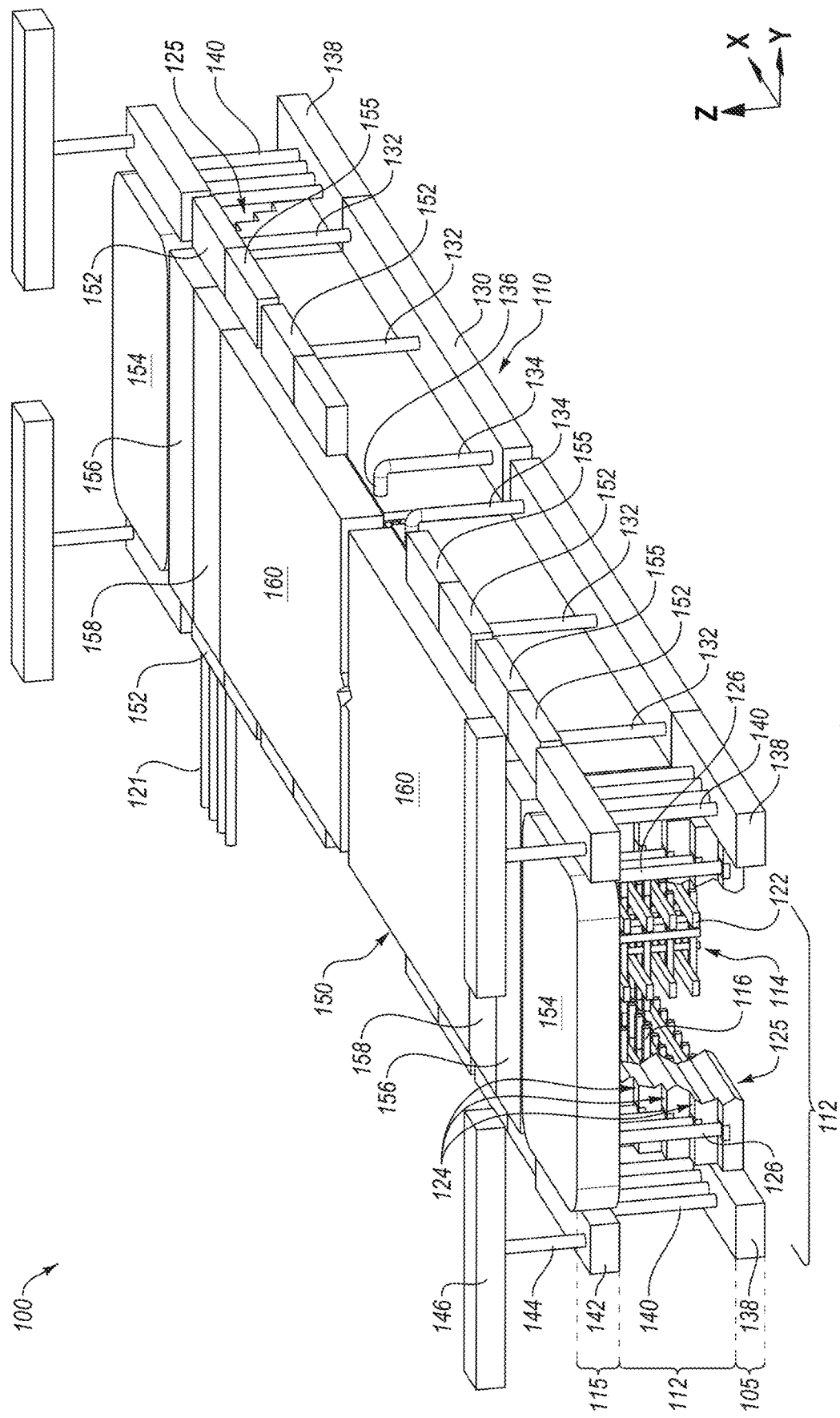
FIG. 1A through FIG. 1F are simplified partial perspective views (FIG. 1A and FIG. 1B), simplified partial planar views (FIG. 1C and FIG. 1D), and simplified partial cross-sectional views (FIG. 1E and FIG. 1F) illustrating a microelectronic device, in accordance with embodiments of the disclosure.

The illustrations included herewith are not meant to be actual views of any particular systems, microelectronic structures, microelectronic devices, or integrated circuits thereof, but are merely idealized representations that are employed to describe embodiments herein. Elements and features common between figures may retain the same numerical designation except that, for ease of following the description, reference numerals begin with the number of the drawing on which the elements are introduced or most fully described.

The following description provides specific details, such as material types, material thicknesses, and processing conditions in order to provide a thorough description of embodiments described herein. However, a person of ordinary skill in the art will understand that the embodiments disclosed herein may be practiced without employing these specific details. Indeed, the embodiments may be practiced in conjunction with conventional fabrication techniques employed in the semiconductor industry. In addition, the description provided herein does not form a complete process flow for manufacturing a microelectronic device (e.g., a semiconductor device, a memory device), apparatus, or electronic system, or a complete microelectronic device, apparatus, or electronic system. The structures described below do not form a complete microelectronic device, apparatus, or electronic system. Only those process acts and structures necessary to understand the embodiments described herein are described in detail below. Additional acts to form a complete microelectronic device, apparatus, or electronic system from the structures may be performed by conventional techniques.

The materials described herein may be formed by conventional techniques including, but not limited to, spin coating, blanket coating, chemical vapor deposition (CVD), atomic layer deposition (ALD), plasma enhanced ALD, physical vapor deposition (PVD), plasma enhanced chemical vapor deposition (PECVD), or low-pressure chemical vapor deposition (LPCVD). Alternatively, the materials may be grown in situ. Depending on the specific material to be formed, the technique for depositing or growing the material may be selected by a person of ordinary skill in the art. The removal of materials may be accomplished by any suitable technique including, but not limited to, etching, abrasive planarization (e.g., chemical-mechanical planarization), or other known methods unless the context indicates otherwise.

As used herein, the term "configured" refers to a size, shape, material composition, orientation, and arrangement of one or more of at least one structure and at least one apparatus facilitating operation of one or more of the structure and the apparatus in a predetermined way.

As used herein, the terms "longitudinal," "vertical," "lateral," and "horizontal" are in reference to a major plane of a substrate (e.g., base material, base structure, base construction, etc.) in or on which one or more structures and/or features are formed and are not necessarily defined by Earth's gravitational field. A "lateral" or "horizontal" direction is a direction that is substantially parallel to the major plane of the substrate, while a "longitudinal" or "vertical" direction is a direction that is substantially perpendicular to the major plane of the substrate. The major plane of the substrate is defined by a surface of the substrate having a relatively large area compared to other surfaces of the substrate. With reference to the figures, a "horizontal" or "lateral" direction may be perpendicular to an indicated "Z" axis, and may be parallel to an indicated "X" axis and/or parallel to an indicated "Y" axis; and a "vertical" or "longitudinal" direction may be parallel to an indicated "Z" axis, may be perpendicular to an indicated "X" axis, and may be perpendicular to an indicated "Y" axis.

As used herein, the term "substantially" in reference to a given parameter, property, or condition means and includes to a degree that one of ordinary skill in the art would understand that the given parameter, property, or condition is met with a degree of variance, such as within acceptable tolerances. By way of example, depending on the particular parameter, property, or condition that is substantially met, the parameter, property, or condition may be at least 90.0 percent met, at least 95.0 percent met, at least 99.0 percent met, at least 99.9 percent met, or even 100.0 percent met.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped, etc.) and the spatially relative descriptors used herein interpreted accordingly.

As used herein, features (e.g., regions, materials, structures, devices) described as "neighboring" one another means and includes features of the disclosed identity (or identities) that are located most proximate (e.g., closest to) one another. Additional features (e.g., additional regions, additional materials, additional structures, additional devices) not matching the disclosed identity (or identities) of the "neighboring" features may be disposed between the "neighboring" features. Put another way, the "neighboring" features may be positioned directly adjacent one another, such that no other feature intervenes between the "neighboring" features; or the "neighboring" features may be positioned indirectly adjacent one another, such that at least one feature having an identity other than that associated with at least one the "neighboring" features is positioned between the "neighboring" features. Accordingly, features described as "vertically neighboring" one another means and includes features of the disclosed identity (or identities) that are located most vertically proximate (e.g., vertically closest to) one another. Moreover, features described as "horizontally neighboring" one another means and includes features of the disclosed identity (or identities) that are located most horizontally proximate (e.g., horizontally closest to) one another.

As used herein, the term "memory device" means and includes microelectronic devices exhibiting memory functionality, but not necessarily limited to memory functionality. Stated another way, and by way of example only, the term "memory device" means and includes not only conventional memory (e.g., conventional volatile memory, such as conventional DRAM; conventional non-volatile memory, such as conventional NAND memory), but also includes an application specific integrated circuit (ASIC) (e.g., a system on a chip (SoC)), a microelectronic device combining logic and memory, and a graphics processing unit (GPU) incorporating memory.

As used herein, "conductive material" means and includes electrically conductive material such as one or more of a metal (e.g., tungsten (W), titanium (Ti), molybdenum (Mo), niobium (Nb), vanadium (V), hafnium (H), tantalum (Ta), chromium (Cr), zirconium (Zr), iron (Fe), ruthenium (Ru), osmium (Os), cobalt (Co), rhodium (Rh), iridium (Ir), nickel (Ni), palladium (Pd), platinum (Pt), copper (Cu), silver (Ag), gold (Au), aluminum (Al)), an alloy (e.g., a Co-based alloy, an Fe-based alloy, an Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a magnesium (Mg)-based alloy, a Ti-based alloy, a steel, a low-carbon steel, a stainless steel), a conductive metal-containing material (e.g., a conductive metal nitride, a conductive metal silicide, a conductive metal carbide, a conductive metal oxide), and a conductively-doped semiconductor material (e.g., conductively-doped polysilicon, conductively-doped germanium (Ge), conductively-doped silicon germanium (SiGe)). In addition, a "conductive structure" means and includes a structure formed of and including a conductive material.

As used herein, "insulative material" means and includes electrically insulative material, such one or more of at least one dielectric oxide material (e.g., one or more of a silicon oxide ($SiO_x$), phosphosilicate glass, borosilicate glass, borophosphosilicate glass, fluorosilicate glass, an aluminum oxide ($AlO_x$), a hafnium oxide ($HfO_x$), a niobium oxide (NbO$_x$), a titanium oxide (TiO$_x$), a zirconium oxide (ZrO$_x$), a tantalum oxide (TaO$_x$), and a magnesium oxide (MgO$_x$)), at least one dielectric nitride material (e.g., a silicon nitride (SiN$_y$)), at least one dielectric oxynitride material (e.g., a silicon oxynitride (SiO$_x$N$_y$)), and at least one dielectric carboxynitride material (e.g., a silicon carboxynitride (Si-O$_x$C$_z$N$_y$)). Formulae including one or more of "x," "y," and "z" herein (e.g., SiO$_x$, AlO$_x$, HfO$_x$, NbO$_x$, TiO$_x$, SiN$_y$, SiO$_x$N$_y$, SiO$_x$C$_z$N$_y$) represent a material that contains an average ratio of "x" atoms of one element, "y" atoms of another element, and "z" atoms of an additional element (if any) for every one atom of another element (e.g., Si, Al, Hf, Nb, Ti). As the formulae are representative of relative atomic ratios and not strict chemical structure, an insulative material may comprise one or more stoichiometric compounds and/or one or more non-stoichiometric compounds, and values of "x," "y," and "z" (if any) may be integers or may be non-integers. As used herein, the term "non-stoichiometric compound" means and includes a chemical compound with an elemental composition that cannot be represented by a ratio of well-defined natural numbers and is in violation of the law of definite proportions. In addition, an "insulative structure" means and includes a structure formed of and including an insulative material.

According to embodiments described herein, a microelectronic device includes a first microelectronic device structure and at least a second microelectronic device structure coupled to the first microelectronic device structure. The first microelectronic device structure may include a memory array region (also referred to herein as an "array region") and a first complementary metal oxide semiconductor (CMOS) region (e.g., a first control logic region) operably coupled to the array region and including first control logic devices configured to effectuate at least a portion of control operations of the array region. The second microelectronic device structure may include a second CMOS region (e.g., a second control logic region) operably coupled to the array region and including second control logic devices configured to effectuate at least an additional portion of control operations of the array region. In some embodiments, the first microelectronic device structure is attached (e.g., bonded) to the second microelectronic device structure by oxide-to-oxide bonding of a first insulative material of the first microelectronic device structure and a second insulative material of the second microelectronic device structure.

The memory array region of the first microelectronic device structure may include vertical stacks of memory cells. The vertical stacks of memory cells of the array region may individually include a vertical stack of storage devices (e.g., capacitors) each storage device operably coupled to a laterally neighboring access device (e.g., a transistor). Vertically neighboring access devices and vertically neighboring storage devices may be vertically spaced from each other by one or more insulative structures. First conductive pillars (also referred to as "digit lines") may vertically extend through a vertical stack of the access devices. First conductive lines (also referred to as "word lines") may vertically neighbor and laterally extend over each level of access devices. The first conductive lines may be configured to operably couple to the access devices to operably couple the access devices to a respective storage device. The first conductive lines may laterally terminate at a stair step structure located at lateral boundaries of the array region. The stair step structure may be defined by steps, the first conductive lines laterally terminating at a step of the stair step structure. Each step may individually be in electrical communication with a second conductive pillar that is, in turn, in electrical communication with one or more control logic devices of the second CMOS region of the second microelectronic device structure. The first CMOS region may vertically neighbor the array region. The first CMOS region may include control logic devices configured for effectuating at least some control operations of the vertical stacks of memory cells. For example, the first CMOS region may include sense amplifier (SA) regions (e.g., SA subregions) operably coupled to control logic devices of the second CMOS region configured to control various operations of the vertical stacks of memory cells. In some embodiments, the first CMOS region includes input/output devices.

The second CMOS region of the second microelectronic device structure may vertically neighbor the array region. In some embodiments, the second CMOS region is located on a vertical side of the array region opposite the first CMOS region. In some such embodiments, the array region may be vertically between (e.g., vertically interposed) the first CMOS region and the second CMOS region. The second CMOS region may include various CMOS circuitry, such as, for example, word line driver circuitry (e.g., sub word line driver circuitry, main word line driver circuitry), row decoders, sense amplifier driver circuitry, column select devices, column decoders, and other CMOS circuitry. In some embodiments, some of the control logic devices of the second CMOS region are electrically coupled to the memory cells of the memory array region and others of the control logic devices of the second CMOS region is electrically coupled to control logic devices of the first CMOS region. For example, the second CMOS region may include sub word line drivers electrically coupled to the memory cells of the memory array region by way of second conductive pillars vertically extending between the steps of the stair step structure and the second CMOS region. In addition, the second CMOS region may include column select devices electrically coupled to the sense amplifiers of the first CMOS region by means of electrically conductive interconnects.

The second microelectronic device structure may further include back end of line (BEOL) structures vertically overlying the second CMOS region. The second CMOS region may be vertically between (e.g., vertically interposed) the array region and the BEOL structures.

Forming the microelectronic device to include the first microelectronic device structure including the first CMOS region and the second microelectronic device structure including the second CMOS region may improve the area efficiency of the microelectronic device, facilitating an increased density of memory cells (e.g., the vertical stacks of memory cells) of the microelectronic device. In addition, the location of the control logic devices of the first CMOS region and the second CMOS region may reduce the length of electrical connection paths of various circuitry of the microelectronic device, enhancing data transfer speeds and overall operating speed of the microelectronic device relative to conventional microelectronic devices.

FIG. 1A through FIG. 1F are simplified partial perspective views (FIG. 1A and FIG. 1B), a simplified partial planar views (FIG. 1C and FIG. 1D), and simplified partial cross-sectional views (FIG. 1E and FIG. 1F) illustrating an embodiment of a microelectronic device 100 (e.g., a memory device, such as a 3D DRAM memory device), in accordance with embodiments of the disclosure. With the description provided below, it will be readily apparent to one of ordinary skill in the art that the methods and structures described herein with reference to FIG. 1A through FIG. 1F may be used in various devices and electronic systems.

Referring to FIG. 1A, the microelectronic device 100 may include a first microelectronic device structure 110 and a second microelectronic device structure 150 attached (e.g., bonded) to the first microelectronic device structure 110. The first microelectronic device structure 110 may be attached to the second microelectronic device structure 150 by, for example, oxide-to-oxide bonding of insulative materials (not illustrated in FIG. 1A for clarity) of the first microelectronic device structure 110 and the second microelectronic device structure 150. The first microelectronic device structure 110 and the second microelectronic device structure 150 may each individually comprise a die or wafer.

The first microelectronic device structure 110 may include an array region 112 including vertical stacks of memory cells 114 vertically overlying complementary metal oxide semiconductor (CMOS) circuitry (e.g., control logic devices) in a first CMOS region 105 of the microelectronic device 100.

The second microelectronic device structure 150 may include a second CMOS region 115 comprising CMOS circuitry (e.g., control logic devices) and vertically (e.g., in the Z-direction) overlying the array region 112 of the microelectronic device 100.

Each of the first CMOS region 105 and the second CMOS region 115 may include control logic devices (e.g., CMOS control logic devices) configured to effectuate at least a portion of control operations for the vertical stacks of memory cells 114. As will be described herein, the locations and relative arrangement of the control logic devices within the first CMOS region 105 and the second CMOS region 115 with respect to each other and the array region 112 may facilitate improved operation of the vertical stacks of memory cells 114. For example, the locations and relative arrangement of the control logic devices may reduce a distance between electrically coupled control logic devices and circuitry, facilitating enhancing data transfer speeds and improved operating speeds of the microelectronic device 100. In addition, the locations and relative arrangement of the control logic devices may facilitate a reduction in the area of the microelectronic device 100 per bit of data and may facilitate an increased density of memory cells per unit area relative to conventional microelectronic device configurations. In some embodiments, the control logic devices of the first CMOS region 105 are different than the control logic devices of the second CMOS region 115.

Figure 1B:
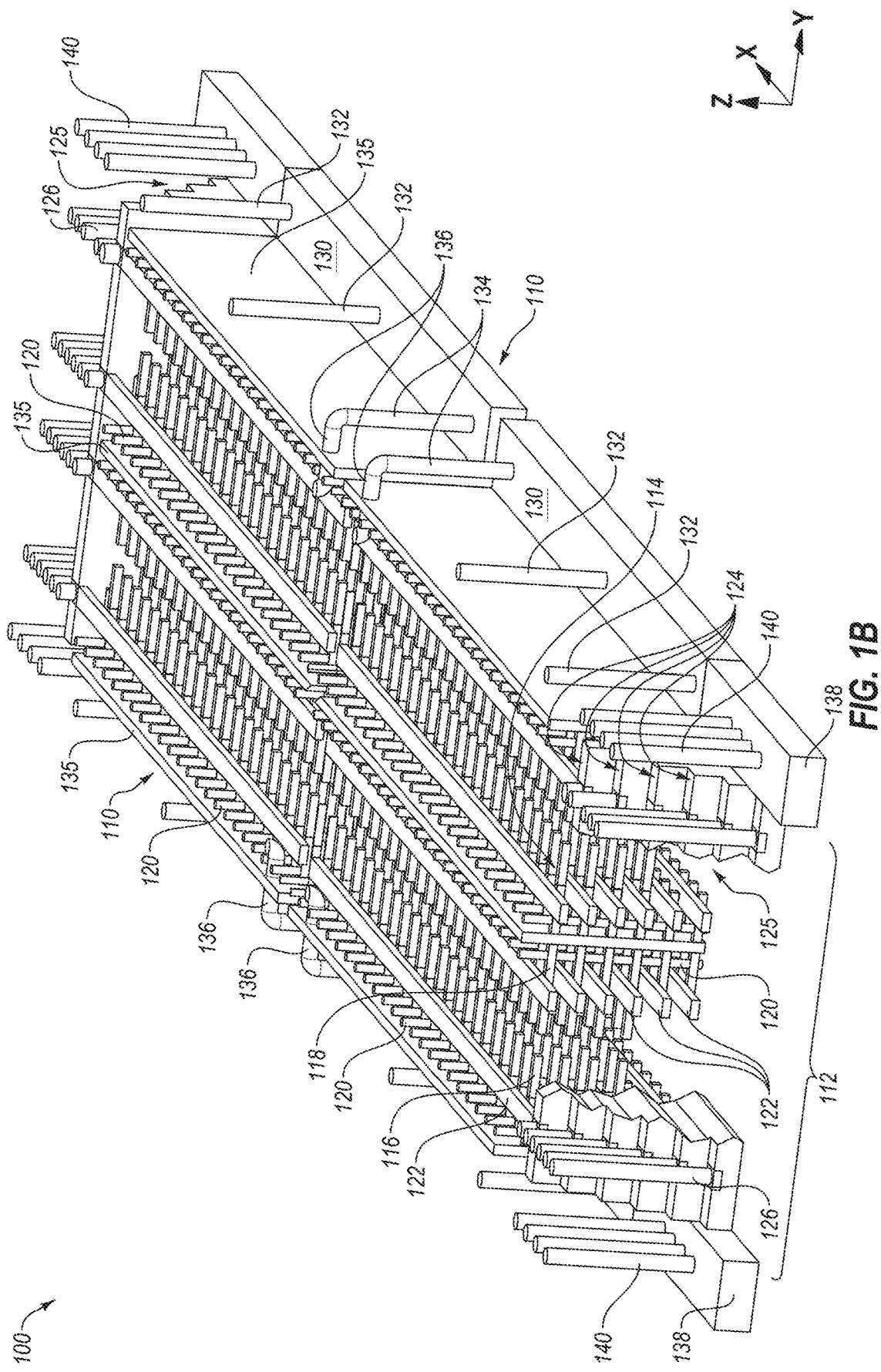

With continued reference to FIG. 1A and FIG. 1B, the vertical stacks of memory cells 114 may each include a vertical stack of storage devices 116 (e.g., capacitor structures), individually laterally (e.g., in the X-direction, in the Y-direction) aligned with an access device 118 of a vertical stack of access devices 118. Each storage device 116 may be electrically coupled to an access device 118 laterally (e.g., in the X-direction) and vertically (e.g., in the Z-direction) aligned with the storage device 116.

First conductive pillars 120 may vertically extend through the access devices 118 and may be configured to electrically couple the access devices 118 to a respective storage device 116. The first conductive pillars 120 may be in electrical communication with a column select device 152 of the second microelectronic device structure 150. In some embodiments, and as illustrated in FIG. 1A, each of the first conductive pillars 120 is individually in electrical communication with a routing structure 121 for electrically coupling the respective first conductive pillar 120 to one of the column select devices 152. For clarity and ease of understanding the description, not all of the each individual routing structure 121 is illustrated in FIG. 1A, but it will be understood that each of the routing structures 121 is in electrical communication a respective one of the first conductive pillars 120 to facilitate electrical communication between first conductive pillars 120 and the column select devices 152. In some embodiments, each column select device 152 is in electrical communication with four of the first conductive pillars 120.

The first conductive pillars 120 may be formed of and include conductive material, such as, for example, one or more of a metal (e.g., tungsten, titanium, nickel, platinum, rhodium, ruthenium, aluminum, copper, molybdenum, iridium, silver, gold), a metal alloy, a metal-containing material (e.g., metal nitrides, metal silicides, metal carbides, metal oxides), a material including at least one of titanium nitride (TiN), tantalum nitride (TaN), tungsten nitride (WN), titanium aluminum nitride (TiAlN), iridium oxide (IrO$_x$), ruthenium oxide (RuO$_x$), alloys thereof, a conductively-doped semiconductor material (e.g., conductively-doped silicon, conductively-doped germanium, conductively-doped silicon germanium, etc.), polysilicon, or other materials exhibiting electrical conductivity. In some embodiments, the first conductive pillars 120 individually comprise tungsten.

With continued reference to FIG. 1A, the column select devices 152 may each laterally (e.g., in the X-direction) neighbor a column decoder 155 and may each be in electrical communication with a laterally neighboring column decoder 155. The column decoders 155 are each, in turn, configured to receive an address signal from, for example, an address decoder.

First conductive lines 122 may extend laterally (e.g., in the Y-direction) over the access devices 118. The first conductive lines 122 may be referred to herein as "word lines." In use and operation, a current may be applied to the first conductive lines 122 to induce a current in a row of the respective access devices 118 and electrically couple the storage device 116 associated with a particular access device 118 to the first conductive pillar 120.

The first conductive lines 122 may be formed of and include conductive material, such as, for example, one or more of the materials described above with reference to the first conductive pillars 120. In some embodiments, the first conductive lines 122 comprise substantially the same material composition as the first conductive pillars 120. In other embodiments, the first conductive lines 122 comprise a different material composition than the first conductive pillars 120. In some embodiments, the first conductive lines 122 comprise tungsten.

The first conductive lines 122 may individually terminate at a stair step structure 125 laterally (e.g., in the X-direction) neighboring the array region 112. The stair step structure 125 may include steps 124 that are vertically (e.g., in the Z-direction) offset from each other and electrically isolated from one another. For example, insulative structures 104 (FIG. 1E, FIG. 1F) and additional insulative structures 106 (FIG. 1E) may vertically intervene between vertically neighboring steps 124.

The number of steps 124 of the stair step structures 125 may correspond to the number of levels of the vertical stack of memory cells 114 (e.g., corresponding to the number of vertical levels of the first conductive lines 122, the storage devices 116, and the access device 118). Although FIG. 1A illustrates that the stair step structures 125 include only a particular number of steps 124, the disclosure is not so limited. The stair step structures 125 may each individually include a desired quantity of the steps 124, such as within a range from thirty-two (32) of the steps 124 to two hundred fifty-six (256) of the steps 124. In some embodiments, the stair step structures 125 each individually include sixty-four (64) of the steps 124. In other embodiments, the stair step structures 125 each individually include a different number of the steps 124, such as less than sixty-four (64) of the steps 124 (e.g., less than or equal to sixty (60) of the steps 124, less than or equal to fifty (50) of the steps 124, less than about forty (40) of the steps 124, less than or equal to thirty (30) of the steps 124, less than or equal to twenty (20) of the steps 124, less than or equal to ten (10) of the steps 124); or greater than sixty-four (64) of the steps 124 (e.g., greater than or equal to seventy (70) of the steps 124, greater than or equal to one hundred (100) of the steps 124, greater than or equal to about one hundred twenty-eight (128) of the steps 124, greater than two hundred fifty-six (256) of the steps 124).

Figure 1C:
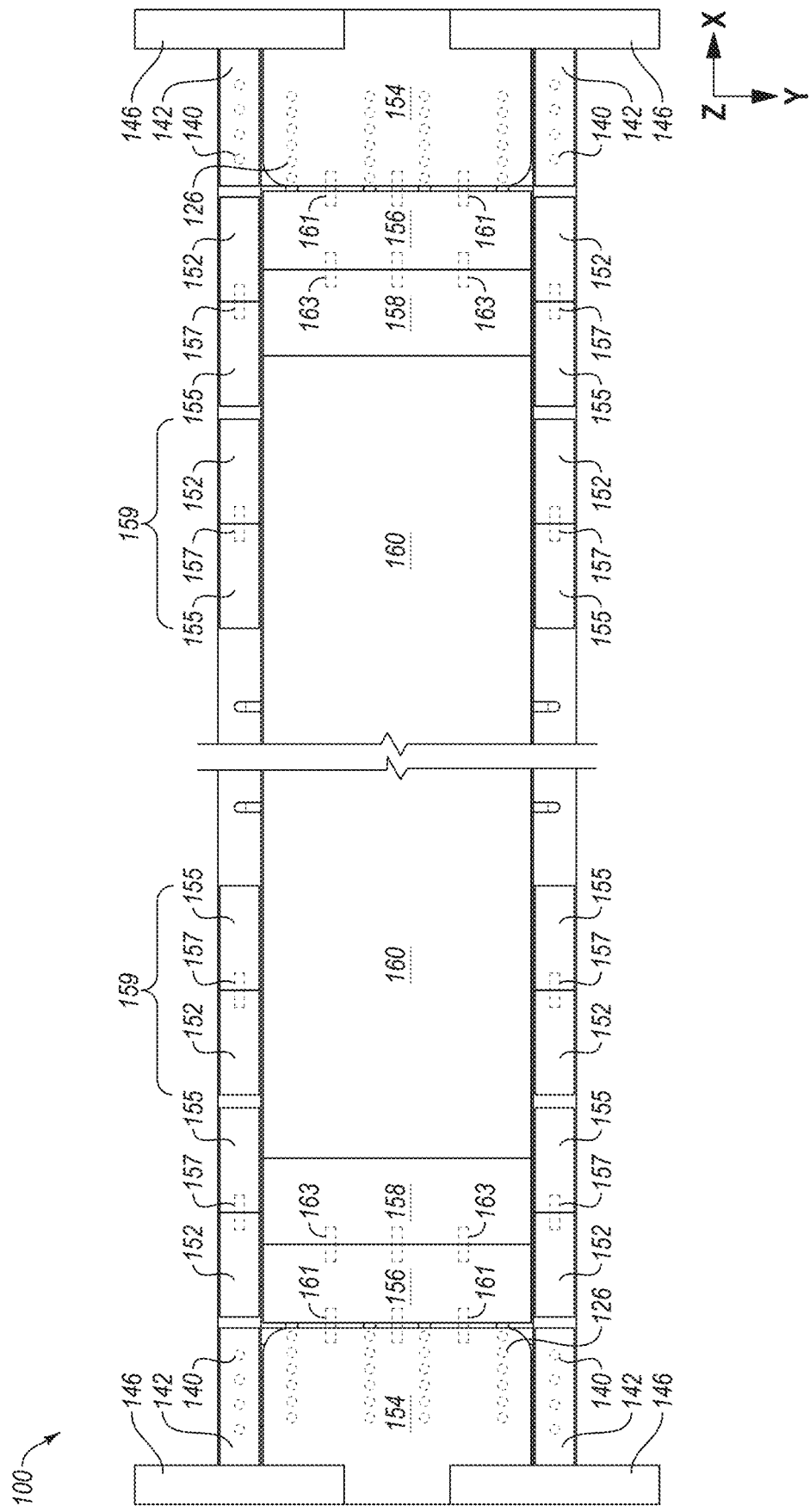

Each step 124 may individually be electrically coupled to a second conductive pillar 126 vertically extending from the first CMOS region 105 to the second CMOS region 115. The second conductive pillars 126 may be electrically coupled to a sub word line driver 154 of the second microelectronic device structure 150. The sub word line driver 154 is, in turn, electrically coupled to a main word line driver 156 by electrical connections 161 (FIG. 1C). The main word line driver 156 is electrically coupled to a row decoder 158 by electrical connections 163 (FIG. 1C). The row decoder 158 may be configured to receive an address signal from, for example, an address decoder, as described above with reference to the column decoder 155.

The second conductive pillars 126 may each individually be formed of and include conductive material, such as, for example, for example, one or more of a metal (e.g., tungsten, titanium, nickel, platinum, rhodium, ruthenium, aluminum, copper, molybdenum, iridium, silver, gold), a metal alloy, a metal-containing material (e.g., metal nitrides, metal silicides, metal carbides, metal oxides), a material including at least one of titanium nitride (TiN), tantalum nitride (TaN), tungsten nitride (WN), titanium aluminum nitride (TiAlN), iridium oxide (IrO$_x$), ruthenium oxide (RuO$_x$), alloys thereof, a conductively-doped semiconductor material (e.g., conductively-doped silicon, conductively-doped germanium, conductively-doped silicon germanium, etc.), polysilicon, or other materials exhibiting electrical conductivity. In some embodiments, the second conductive pillars 126 comprise substantially the same material composition as the first conductive pillars 120. In some embodiments, the second conductive pillars 126 individually comprise tungsten.

The column select devices 152 may each be electrically coupled to one or more SA devices of a SA region 130 (e.g., a SA subregion) by way of first conductive interconnect structures 132. The SA devices of the SA region 130 may, for example, include or more of equalization (EQ) amplifiers, isolation (ISO) amplifiers, NMOS sense amplifiers (NSAs) (also referred to as N sense amplifiers), and PMOS sense amplifiers (PSAs) (also referred to as P sense amplifiers).

The first conductive interconnect structures 132 may be formed of and include conductive material, such as one or more of the materials described above with reference to the second conductive pillars 126. In some embodiments, the first conductive interconnect structures 132 comprise tungsten. In other embodiments, the first conductive interconnect structures 132 comprise copper.

With continued reference to FIG. 1A, the second microelectronic device structure 150 may further include a sense amplifier driver region 160. The sense amplifier driver region 160 may include NMOS sense amplifier drivers (RNL) and PMOS sense amplifier drivers (ACT). The NMOS sense amplifier drivers may generate, for example, activation signals for driving the NMOS sense amplifiers of the sense amplifier regions 130 of the first CMOS region 105 and the PMOS sense amplifier drivers may generate, for example, activation signals for driving the PMOS sense amplifiers of the sense amplifier regions 130 of the first CMOS region 105. By way of non-limiting example, NMOS sense amplifier drivers generate a low potential (e.g., ground) activation signal for activating an NMOS sense amplifier of the sense amplifier region 130 and the PMPS sense amplifier drivers generate a high potential (e.g., V$_{cc}$) activation signal for activating a PMOS sense amplifier of the sense amplifier region 130. However, the disclosure is not so limited and the NMOS sense amplifier drivers and the PMOS sense amplifier drivers may generate sense amplifier activation signals other than those described.

Devices and circuitry of the sense amplifier driver region 160 of the second CMOS region 115 may be electrically coupled to devices and circuitry of the sense amplifier regions 130 of the first CMOS regions by way of second conductive interconnect structures 134. In some embodiments, the second conductive interconnect structures 134 include a first group of the second conductive interconnect structures 134 electrically connecting devices (e.g., NMOS sense amplifiers) and circuitry of the sense amplifier regions 130 to NMOS sense amplifier drivers of the sense amplifier driver region 160, and a second group of second conductive interconnect structures 134 electrically connecting additional devices (e.g., PMOS sense amplifiers) and circuitry of the sense amplifier regions 130 to PMOS sense amplifier drivers of the sense amplifier driver region 160.

In some embodiments, the second conductive interconnect structures 134 include first routing structures 136 for laterally (e.g., in the X-direction, in the Y-direction) routing the second conductive interconnect structures 134. In some such embodiments, electrical connections of the second conductive interconnect structures 134 to devices and circuitry of the sense amplifier driver region 160 do not directly vertically (e.g., in the Z-direction) overlie the electrical connections of the second conductive interconnect structures 134 to devices and circuitry of the sense amplifier regions 130. The sense amplifier driver region 160 of the second CMOS region 115 may be laterally (e.g., in the Y-direction) offset from the sense amplifier regions 130 of the first CMOS region 105. In some embodiments, the sense amplifier regions 130 is located outside of lateral (e.g., in the Y-direction) boundaries of the sense amplifier driver region 160.

The second conductive interconnect structures 134 may be formed of and include conductive material, such as one or more of the materials described above with reference to the first conductive interconnect structures 132. In some embodiments, the second conductive interconnect structures 134 comprise substantially the same material composition as the first conductive interconnect structures 132. In some embodiments, the second conductive interconnect structures 134 comprise tungsten.

With continued reference to FIG. 1A, the first CMOS region 105 of the first microelectronic device structure 110 further includes input/output (I/O) devices 138.

The I/O devices 138 may be operably coupled to the second microelectronic device structure 150 by third conductive interconnect structures 140 vertically (e.g., in the Z-direction) extending through the first microelectronic device structure 110. The third conductive interconnect structures 140 may be electrically connected to a metallization level 142 configured to electrically connect the third conductive interconnect structures 140 to a global input/output device by means of global routing structures 146 and fourth conductive interconnect structures 144.

The third conductive interconnect structures 140, the fourth conductive interconnect structures 144, and the metallization level 142 may individually be formed of and include conductive material, such as one or more of the materials described above with reference to the first conductive interconnect structures 132. In some embodiments, each of the third conductive interconnect structures 140, the fourth conductive interconnect structures 144, and the metallization level 142 individually comprise tungsten.

The global routing structures 146 may be formed of and include conductive material. In some embodiments, the global routing structures 146 comprises copper.

As will be described herein, the sense amplifier regions 130, the I/O devices 138, the column select devices 152, the column decoders 155, the main word line drivers 156, the row decoders 158, the sense amplifier driver region 160 each individually include circuitry including transistors.

Accordingly, the first CMOS region 105 may include control logic devices (e.g., the sense amplifiers within the sense amplifier regions 130, the I/O devices 138) configured for effectuating control operations for the vertical stacks of memory cells 114 and the second CMOS region 115 may include additional control logic devices (e.g., the sub word line drivers 154, the main word line drivers 156, the row decoders 158, the sense amplifiers of the sense amplifier driver region 160, the column select devices 152, the column decoders 155) at least configured for effectuating additional control operations for the vertical stacks of memory cells 114. At least some of the control logic devices of the second CMOS region 115 may be different than the control logic devices of the first CMOS region 105. In some embodiments, the array region 112 is vertically (e.g., in the Z-direction) interposed between the first CMOS region 105 of the first microelectronic device structure 110 and the second CMOS region 115 of the second microelectronic device structure 150.

Figure 1D:
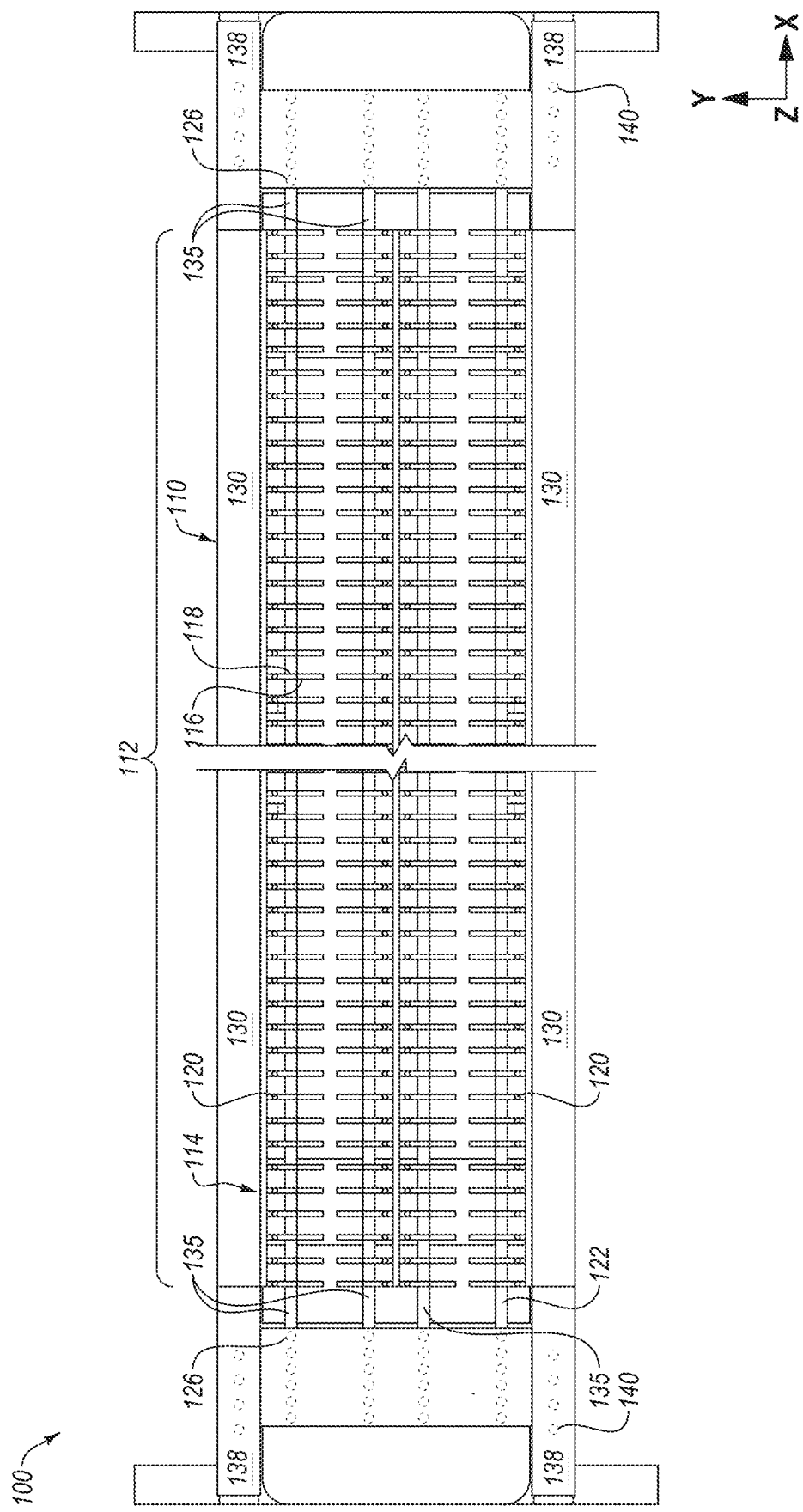

FIG. 1C is a simplified partial planar (top-down) view of the microelectronic device 100 and FIG. 1D is a simplified partial planar (bottom-up) view of the first microelectronic device structure 110. With reference to FIG. 1C, the second CMOS region 115 may include the sub word line drivers 154 at and/or proximate lateral (e.g., in the X-direction) edges of the second microelectronic device structure 150. A main word line driver 156 may laterally (e.g., in the X-direction) neighbor each of the sub word line drivers 154. A row decoder 158 may laterally (e.g., in the X-direction) neighbor a main word line driver 156. The main word line drivers 156 may be laterally between a sub word line driver 154 and a row decoder 158. The sense amplifier driver region 160 may laterally (e.g., in the X-direction) neighbor the row decoders 158 and may be laterally between row decoders 158.

In some embodiments, the sub word line drivers 154, the main word line drivers 156, the row decoders 158, and the sense amplifier driver region 160 are located within lateral (e.g., in the Y-direction) boundaries of the array region 112 of the first microelectronic device structure 110. In some embodiments, the row decoders 158 and the sense amplifier driver region 160 are located within other lateral (e.g., in the X-direction) boundaries of the array region 112 and the sub word line drivers 154 and the main word line drivers 156 may be located outside of the other lateral boundaries of the array region 112. In some such embodiments, the row decoders 158 and the sense amplifier driver region 160 directly vertically (e.g., in the Z-direction) overlie the array region 112.

The sub word line drivers 154 may directly vertically (e.g., in the Z-direction) overlie the stair step structures 125 (FIG. 1A, FIG. 1B). In some such embodiments, the sub word line drivers 154 directly vertically overlie the steps 124 and the second conductive pillars 126 (FIG. 1A, FIG. 1B, FIG. 1D). In some such embodiments, a distance between the first conductive lines 122 and the sub word line drivers 154 may be relatively smaller compared to microelectronic devices where conductive structures in contact with stair step structures are vertically routed over the stair step structure and rerouted to a location vertically under the stair step structure. Accordingly, data transmission speeds between the sub word line driver 154 and the first conductive lines 122 may be reduced due to the relatively short distance between the first conductive lines 122 and the sub word line drivers 154 (e.g., the relatively short dimension of the second conductive pillars 126).

As discussed above, the sub word line drivers 154 may be electrically coupled to the main word line drivers 156 by way of electrical connections 161. In some embodiments, the sub word line drivers 154 may receive signals (e.g., address signals) from an associated main word line driver 156 laterally neighboring the sub word line driver 154. Positioning the main word line driver 156 to directly laterally neighbor the sub word line driver 154 may facilitate improved (e.g., faster) data transmission of signals between (e.g., from) the main word line driver 156 to the associated sub word line driver 154.

Each main word line driver 156 may laterally (e.g., in the X-direction) neighbor a row decoder 158 and may be electrically coupled to a row decoder 158 by electrical connections 163. In some embodiments, the main word line driver 156 receives signals (e.g., address signals) from the laterally neighboring row decoder 158. Locating the row decoders 158 directly laterally neighboring an associated main word line driver 156 may facilitate improved (e.g., faster) data transmission of signals between (e.g., from) the row decoder 158 to the associated main word line driver 156.

The sub word line drivers 154, the main word line drivers 156, the row decoders 158, and the sense amplifier driver region 160 may be laterally (e.g., in the Y-direction) offset from the column select devices 152 and the column decoders 155. In some embodiments, the column select devices 152 and the column decoders 155 are located outside lateral (e.g., in the Y-direction) boundaries of the array region 112.

In some embodiments, the sub word line drivers 154 each individually occupy a relatively larger area (e.g., in the XY plane) than each of the main word line drivers 156, the row decoders 158, the column select devices 152, and the column decoders 155. In some embodiments, each of the main word line drivers 156 occupy substantially the same amount of area (e.g., in the XY plane) as each of the row decoders 158. In some embodiments, the sense amplifier driver region 160 occupy a larger area than each of the sub word line drivers 154, the main word line drivers 156, the row decoders 158, the column select devices 152 and the column decoders 155.

Each of the column select devices 152 may individually occupy substantially the same area (e.g., in the XY plane) as each individual one of the column decoders 155. The column select devices 152 and the column decoders 155 may each individually occupy a smaller area than each of the sub word line drivers 154, the main word line drivers 156, the row decoders 158, and the sense amplifier driver region 160.

With reference to FIG. 1C, the column select devices 152 and the column decoders 155 may be arranged in pairs 159. For example, each column select device 152 may be electrically coupled with a laterally (e.g., in the X-direction) neighboring column decoder 155, such as by way of electrical connections 157. The electrical connections 157 may be formed of and include conductive material. The electrical connections 157 may facilitate transmission of signals between (e.g., from) the column decoder 155 to the associated laterally neighboring column select device 152.

As described above, the column select devices 152 may be electrically coupled to the sense amplifier region 130 directly vertically (e.g., in the Z-direction) underlying the column select devices 152 by way of the first conductive interconnect structures 132. Locating the column select devices 152 directly vertically above the sense amplifier region 130 may facilitate improved (e.g., faster) data transmission of signals between the sense amplifier region 130 and the column select devices 152.

In some embodiments, the second CMOS region 115 includes the metallization level 142 that is electrically coupled to the global routing structures 146 and the I/O devices 138 of the first CMOS region 105. The global routing structures 146 and the I/O devices 138 may be located outside lateral (e.g., in the X-direction, in the Y-direction) boundaries of the array region 112.

With reference to FIG. 1D, the I/O devices 138 may directly vertically (e.g., in the Z-direction) underlie the metallization level 142 and the global routing structures 146 of the second CMOS region 115. In FIG. 1D, the array region 112 including the vertical stacks of memory cells 114 are illustrated. However, it will be understood that the array region 112 would be located behind the plane of the view of FIG. 1D since the array region 112 would be covered by the first CMOS region 105.

The sense amplifier regions 130 may be located outside lateral (e.g., in the Y-direction) boundaries of the array region 112 and within other lateral (e.g., in the X-direction) boundaries of the array region 112.

Figure 1E:
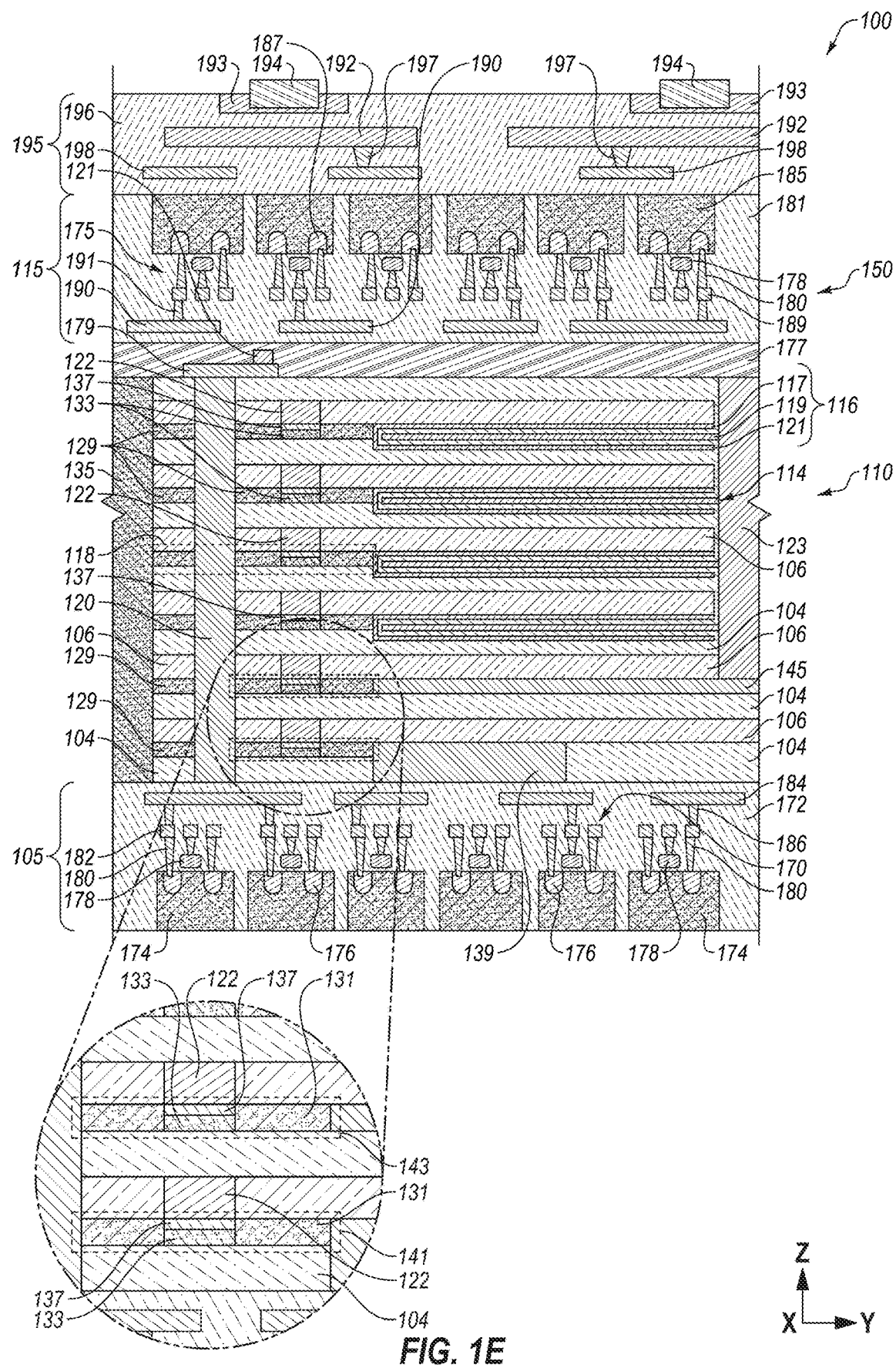
Figure 1F:
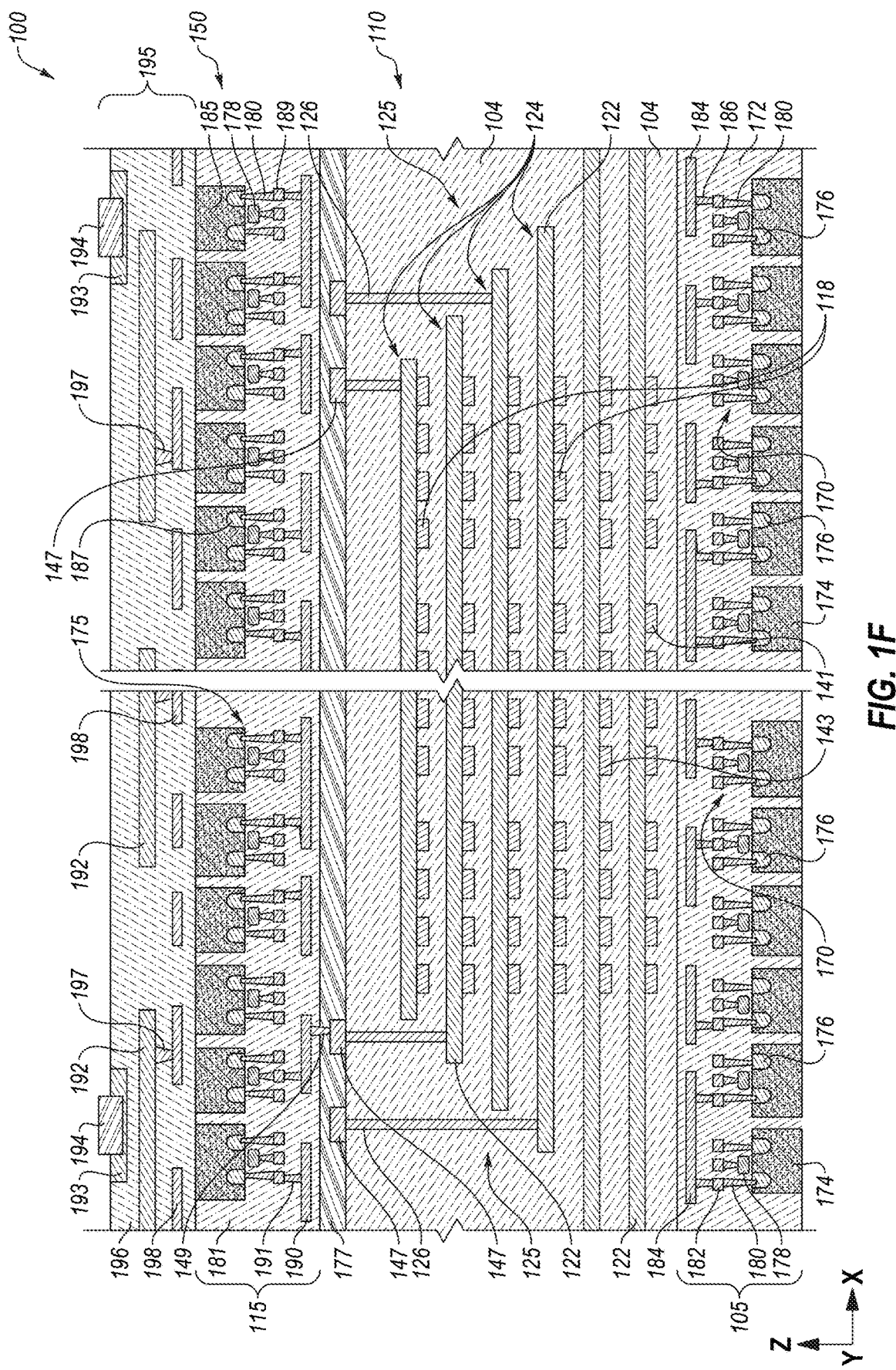

FIG. 1E is a simplified partial cross-sectional view of the microelectronic device 100 taken in the Y-direction through a vertical stack of the memory cells 114 and FIG. 1F is a simplified partial cross-sectional view of the microelectronic device 100 in the X-direction and taken through a stair step structure 125.

With collective reference to FIG. 1E and FIG. 1F, the first CMOS region 105 of the first microelectronic device structure 110 may include transistor structures 170 within a first insulative material 172. As described above, the first CMOS region 105 may include, for example, the sense amplifier regions 130 and the I/O devices 138. Stated another way, each of the sense amplifier regions 130 and the I/O devices 138 individually are formed of and include transistor structures 170.

In some embodiments, the first CMOS regions 105 may further include (e.g., in addition to the sense amplifier regions 130 and the I/O devices 138) one or more (e.g., each) of charge pumps (e.g., $V_{CCP}$ charge pumps, $V_{NEGWL}$ charge pumps, DVC2 charge pumps), delay-locked loop (DLL) circuitry (e.g., ring oscillators), drain supply voltage ($V_{DD}$) regulators, control devices configured to control column operations and/or row operations for arrays (e.g., the array region 112) of the first microelectronic device structure 110, such as decoders (e.g., local deck decoders), repair circuitry (e.g., column repair circuitry, row repair circuitry), memory test devices, array multiplexers (MUX), and error checking and correction (ECC) devices, self-refresh/wear leveling devices, page buffers, data paths, I/O devices (e.g., local I/O devices) and controller logic (timing circuitry, clock devices (e.g., a global clock device)), deck enable, read/write circuitry, address circuitry, or other logic devices and circuitry, and various chip/deck control circuitry. The devices and circuitry included in the first CMOS region 105 may employ different conventional conductive metal-oxide-semiconductor (CMOS) devices (e.g., conventional CMOS inverters, conventional CMOS NAND gates, conventional CMOS transmission pass gates, etc.), which are not described in detail herein.

In some embodiments, the first CMOS region 105 comprises a silicon wafer. In addition, the first CMOS region 105 may include different layers, structures, devices, and/or regions formed therein and/or thereon.

The first insulative material 172 may be formed of and include, for example, insulative material such as, for example, one or more of an oxide material (e.g., silicon dioxide ($SiO_2$), phosphosilicate glass, borosilicate glass, borophosphosilicate glass, fluorosilicate glass, titanium dioxide ($TiO_2$), hafnium oxide ($HfO_2$), zirconium dioxide ($ZrO_2$), hafnium dioxide ($HfO_2$), tantalum oxide ($TaO_2$), magnesium oxide (MgO), aluminum oxide ($Al_2O_3$), or a combination thereof), and amorphous carbon. In some embodiments, the first insulative material 172 comprises silicon dioxide.

The transistor structures 170 may include a first base structure 174 including conductively-doped regions 176 (e.g., source and drain regions) and gate structures 178 laterally extending between the conductively-doped regions 176.

The first base structure 174 may include a conventional silicon substrate (e.g., a conventional silicon wafer), or another bulk substrate comprising a semiconductive material. As used herein, the term "bulk substrate" means and includes not only silicon substrates, but also silicon-on-insulator (SOI) substrates, such as silicon-on-sapphire (SOS) substrates and silicon-on-glass (SOG) substrates, epitaxial layers of silicon on a base semiconductive foundation, and other substrates formed of and including one or more semiconductive materials (e.g., one or more of a silicon material, such monocrystalline silicon or polycrystalline silicon; silicon-germanium; germanium; gallium arsenide; a gallium nitride; and indium phosphide). In some embodiments, the first base structure 174 comprises a silicon wafer.

In some embodiments, the first base structure 174 comprises conductively-doped regions 176 and undoped regions. The conductively-doped regions 176 may, for example, be employed as source regions and drain regions for the transistor structures 170 and the undoped regions may, for example, be employed as channel regions for the transistor structures 170. In some embodiments, the conductively-doped regions 176 each individually comprise one or more semiconductive materials doped with at least one conductivity enhancing chemical species, such as at least one N-type dopant (e.g., one or more of arsenic, phosphorous, antimony, and bismuth) or at least one P-type dopant (e.g., one or more of boron, aluminum, and gallium). In some embodiments, the conductively-doped regions 176 comprise conductively-doped silicon.

The conductively-doped regions 176 and the gate structures 178 may be electrically coupled to conductive interconnect structures 180. The conductive interconnect structures 180 may be formed of and include conductive material. In some embodiments, the conductive interconnect structures 180 individually comprise tungsten.

The conductive interconnect structures 180 may individually electrically couple the conductively-doped regions 176 and the gate structures 178 to one or more muting structures 182 and pad structures 184. The pad structures 184 may be in electrical communication with the routing structures 182 by means of conductive interconnect structures 186.

The conductive interconnect structures 180, the routing structures 182, the pad structures 184, and the conductive interconnect structures 186 may individually be formed of and include conductive material. In some embodiments, the conductive interconnect structures 180, the routing structures 182, the pad structures 184, and the conductive interconnect structures 186 individually comprise tungsten. In other embodiments, the conductive interconnect structures 180, the muting structures 182, the pad structures 184, and the conductive interconnect structures 186 individually comprise copper.

In some embodiments, the pad structures 184 are electrically connected to, for example, the sense amplifier regions 130 and the I/O devices 138 by means of the first conductive interconnect structures 132, the second conductive interconnect structures 134, and the third conductive interconnect structures 140.

With continued reference to FIG. 1E, each of the storage devices 116 may individually include a first electrode 117 (also referred to herein as an "outer electrode," "a first electrode plate," or a "first node"), a second electrode 119 (also referred to herein as an "inner electrode," "a second electrode plate," or a "second node"), and a dielectric material 121 between the first electrode 117 and the second electrode 119. In some such embodiments, the storage device 116 individually comprise capacitors. However, the disclosure is not so limited and in other embodiments, the storage device 116 may each individually comprise other structures, such as, for example, phase change memory (PCM), resistance random-access memory (RRAM), conductive-bridging random-access memory (conductive bridging RAM), or another structure for storing a logic state.

The first electrode 117 may be formed of and include conductive material such as, for example, one or more of a metal (e.g., tungsten, titanium, nickel, platinum, rhodium, ruthenium, aluminum, copper, molybdenum, iridium, silver, gold), a metal alloy, a metal-containing material (e.g., metal nitrides, metal silicides, metal carbides, metal oxides), a material including at least one of titanium nitride (TiN), tantalum nitride (TaN), tungsten nitride (WN), titanium aluminum nitride (TiAlN), iridium oxide (IrO$_x$), ruthenium oxide (RuO$_x$), alloys thereof, a conductively-doped semiconductor material (e.g., conductively-doped silicon, conductively-doped germanium, conductively-doped silicon germanium, etc.), polysilicon, or other materials exhibiting electrical conductivity. In some embodiments, the first electrode 117 comprises titanium nitride.

The second electrode 119 may be formed of and include conductive material. In some embodiments, the second electrode 119 comprises one or more of the materials described above with reference to the first electrode 117. In some embodiments, the second electrode 119 comprises substantially the same material composition as the first electrode 117.

The dielectric material of routing structure 121 may be formed of and include one or more of silicon dioxide, silicon nitride, polyimide, titanium dioxide (TiO$_2$), tantalum oxide (Ta$_2$O$_5$), aluminum oxide (Al$_2$O$_3$), an oxide-nitride-oxide material (e.g., silicon dioxide-silicon nitride-silicon dioxide), strontium titanate (SrTiO$_3$) (STO), barium titanate (BaTiO$_3$), hafnium oxide (HfO$_2$), zirconium oxide (ZrO$_2$), a ferroelectric material (e.g., ferroelectric hafnium oxide, ferroelectric zirconium oxide, lead zirconate titanate (PZT), etc.), or a high-k dielectric material.

The second electrode 119 may be in electrical communication with a conductive structure 123. The conductive structure 123 may be formed of and include conductive material, such as one or more of the materials described above with reference to the second electrode 119. In some embodiments, the conductive structure 123 comprises substantially the same material composition as the second electrode 119. In other embodiments, the conductive structure 123 comprises a different material composition than the second electrode 119.

With continued reference to FIG. 1E, in some embodiments, the access devices 118 (one of which is illustrated in FIG. 1E in box 118) each individually include a source material 129, a drain material 131, and a channel material 133 laterally (e.g., in the Y-direction) between the source material 129 and the drain material 131. The source material 129 and the drain material 131 may each individually comprise a semiconductive material (e.g., polysilicon) doped with at least one N-type dopant, such as one or more of arsenic ions, phosphorous ions, and antimony ions. In other embodiments, the source material 129 and the drain material 131 each individually comprise a semiconductive material doped with at least one P-type dopant, such as boron ions.

In some embodiments, the channel material 133 comprises a semiconductive material (e.g., polysilicon) doped with at least one of at least one N-type dopant and at least one P-type dopant. In some embodiments, the channel material 133 is doped with one of at least one N-type dopant and at least one P-type dopant and each of the source material 129 and the drain material 131 are each individually doped with the other of the at least one N-type dopant and the at least one P-type dopant.

In some embodiments, the source material 129 of each access device 118 is electrically connected to a conductive plate 135 and the drain material 131 of each access device 118 is electrically connected to a laterally (e.g., in the Y-direction) neighboring storage device 116, such as to the first electrode 117 of the laterally neighboring storage device 116.

The first conductive lines 122 may extend laterally (e.g., in the X-direction; in and out of the page in the view of FIG. 1E) as lines and may be each be configured to be operably coupled to a vertically (e.g., in the Z-direction) neighboring channel material 133 of the access devices 118. In other words, a first conductive line 122 may be configured to operably couple to a vertically (e.g., in the Z-direction) neighboring access device 118.

The channel material 133 may be separated from the first conductive lines 122 by a dielectric material 137, which may also be referred to herein as a "gate dielectric material." The dielectric material 137 may be formed of and include insulative material. By way of non-limiting example, the dielectric material 137 may comprise one or more of phosphosilicate glass, borosilicate glass, borophosphosilicate glass (BPSG), fluorosilicate glass, silicon dioxide, titanium dioxide, zirconium dioxide, hafnium dioxide, tantalum oxide, magnesium oxide, aluminum oxide, niobium oxide, molybdenum oxide, strontium oxide, barium oxide, yttrium oxide, a nitride material, (e.g., silicon nitride (Si$_3$N$_4$)), an oxynitride (e.g., silicon oxynitride), another gate dielectric material, a dielectric carbon nitride material (e.g., silicon carbon nitride (SiCN)), or a dielectric carboxynitride material (e.g., silicon carboxynitride (SiOCN)).

In some embodiments, insulative structures 104 and additional insulative structures 106 may vertically (e.g., in the Z-direction) intervene between vertically neighboring access devices 118 and vertically neighboring storage devices 116. The additional insulative structures 106 may laterally (e.g., in the Y-direction) neighbor each of the first conductive lines 122.

The insulative structures 104 may be formed of and include insulative material. In some embodiments, the insulative structures 104 may each individually be formed of and include, for example, an insulative material, such as one or more of an oxide material (e.g., silicon dioxide ($SiO_2$), phosphosilicate glass, borosilicate glass, borophosphosilicate glass, fluorosilicate glass, titanium dioxide ($TiO_2$), hafnium oxide ($HfO_2$), zirconium dioxide ($ZrO_2$), hafnium dioxide ($HfO_2$), tantalum oxide ($TaO_2$), magnesium oxide (MgO), aluminum oxide ($Al_2O_3$), or a combination thereof), and amorphous carbon. In some embodiments, the insulative structures 104 comprise silicon dioxide. Each of the insulative structures 104 may individually include a substantially homogeneous distribution of the at least one insulating material, or a substantially heterogeneous distribution of the at least one insulating material. As used herein, the term "homogeneous distribution" means amounts of a material do not vary throughout different portions (e.g., different horizontal portions, different vertical portions) of a structure. Conversely, as used herein, the term "heterogeneous distribution" means amounts of a material vary throughout different portions of a structure. Amounts of the material may vary stepwise (e.g., change abruptly), or may vary continuously (e.g., change progressively, such as linearly, parabolically) throughout different portions of the structure. In some embodiments, each of the insulative structures 104 exhibits a substantially homogeneous distribution of insulative material. In additional embodiments, at least one of the insulative structures 104 exhibits a substantially heterogeneous distribution of at least one insulative material. The insulative structures 104 may, for example, be formed of and include a stack (e.g., laminate) of at least two different insulative materials. The insulative structures 104 may each be substantially planar, and may each individually exhibit a desired thickness.

The additional insulative structures 106 may be formed of and include an insulative material that is different than, and that has an etch selectivity with respect to, the insulative structures 104. In some embodiments, the additional insulative structures 106 are formed of and include a nitride material (e.g., silicon nitride ($Si_3N_4$)) or an oxynitride material (e.g., silicon oxynitride). In some embodiments, the additional insulative structures 106 comprise silicon nitride.

With continued reference to FIG. 1E the first conductive pillars 120 (only one of which is illustrated in the cross-sectional view of FIG. 1E) may vertically (e.g., in the Z-direction) extend into the vertical stack of memory cells 114 and may be in electrical communication with the access devices 118 of the vertical stack of memory cells 114. In some embodiments, the first conductive pillars 120 each vertically extend through the access devices 118 and are in electrical communication with, for example, the source material 129 of the access devices 118. In some embodiments, the first conductive pillars 120 are in electrical communication with the first base structure 174.

In some embodiments, the first microelectronic device structure 110 includes a metallization structure 139 (also referred to herein as a "global digit line") formed of and including conductive material. The metallization structure 139 (not illustrated in FIG. 1A for clarity and ease of understanding the description) may be configured to be in electrical communication with more than one of the first conductive pillars 120 and may be configured to selectively provide power (e.g., a current) to the first conductive pillars 120 through, for example, a vertically (e.g., in the Z-direction) nearest one of the access devices 118 that is in contact with the metallization structure 139. In some embodiments, the metallization structure 139 may be operably coupled to a vertically (e.g., in the Z-direction) lowermost access device 118 configured for operably coupling the metallization structure 139 to the first conductive pillars 120. The vertically lowermost access device 118 may be referred to herein as a multiplexer 141 (illustrated in broken lines in FIG. 1E). The multiplexer 141 may comprise a select device for operably coupling a first conductive pillar 120 to which is it coupled to a global digit line through the metallization structure 139.

In some embodiments, the metallization structure 139 comprises a material exhibiting a relatively low RC value to facilitate an increased speed of data transmission. In some embodiments, the metallization structure 139 comprises copper. In other embodiments, the metallization structure 139 comprises tungsten.

In some embodiments, an access device 118 vertically (e.g., in the Z-direction) neighboring (e.g., vertically above) the multiplexer 141 may comprise a transistor 143 (illustrated in broken lines in FIG. 1E) configured to electrically couple the first conductive pillar 120 to the conductive structure 123 through an additional conductive structure 145.

The additional conductive structure 145 may comprise one or more of the conductive materials described above with reference to the metallization structure 139. In some embodiments, the additional conductive structure 145 comprises substantially the same material composition as the metallization structure 139. In some embodiments, the additional conductive structure 145 comprises copper.

In some embodiments, the first microelectronic device structure 110 comprises a second insulative material 177 vertically overlying the vertical stack of memory cells 114. The second insulative material 177 may be formed of and include insulative material, such as one or more of the materials described above with reference to the first insulative material 172. In some embodiments, the second insulative material 177 comprises substantially the same material composition as the first insulative material 172. In some embodiments, the second insulative material 177 comprises an oxide material, such as silicon dioxide.

A conductive pad structure 179 may be in electrical communication with the first conductive pillar 120. The conductive pad structure 179 may be in electrical communication with a muting structure (e.g., routing structure 121) configured to electrically couple the first conductive pillar 120 to, for example, one of the column select devices 152 (FIG. 1A).

The conductive pad structure 179 may be formed of and include conductive material. In some embodiments, the conductive pad structure 179 comprises tungsten.

With collective reference to FIG. 1E and FIG. 1F, the second microelectronic device structure 150 may be attached (e.g., bonded) to the first microelectronic device structure 110. For example, the second microelectronic device structure 150 may include a third insulative material 181 attached (e.g., bonded) to the second insulative material 177 of the first microelectronic device structure 110. The third insulative material 181 may be formed of and include insulative material, such as one or more of the materials described above with reference to the first insulative material 172 and the second insulative material 177. In some embodiments, the third insulative material 181 comprises substantially the same material composition as the second insulative material 177. In some embodiments, the third insulative material 181 comprises silicon dioxide.

The second CMOS region 115 of the second microelectronic device structure 150 may include transistor structures 175 within the third insulative material 181. The second CMOS region 115 may include, for example, the column select devices 152, the column decoders 155, the main word line drivers 156, the row decoders 158, and the sense amplifier driver region 160. Stated another way, each of the column select devices 152, the column decoders 155, the main word line drivers 156, the row decoders 158, and the sense amplifier driver region 160 are individually formed of and include transistor structures 175.

In some embodiments, the second CMOS region 115 further includes (e.g., in addition to the column select devices 152, the column decoders 155, the main word line drivers 156, the row decoders 158, the sense amplifier driver region 160) one or more (e.g., each) of charge pumps (e.g., $V_{CCP}$ charge pumps, $V_{NEGWL}$ charge pumps, DVC2 charge pumps), delay-locked loop (DLL) circuitry (e.g., ring oscillators), drain supply voltage ($V_{DD}$) regulators, control devices configured to control column operations and/or row operations for arrays (e.g., the array region 112) of the second microelectronic device structure 150, such as decoders (e.g., local deck decoders), repair circuitry (e.g., column repair circuitry, row repair circuitry), memory test devices, array multiplexers (MUX), and error checking and correction (ECC) devices, self-refresh/wear leveling devices, page buffers, data paths, I/O devices (e.g., local I/O devices) and controller logic (timing circuitry, clock devices (e.g., a global clock device)), deck enable, read/write circuitry, address circuitry, or other logic devices and circuitry, and various chip/deck control circuitry. The devices and circuitry included in the second CMOS region 115 may employ different conventional conductive metal-oxide-semiconductor (CMOS) devices (e.g., conventional CMOS inverters, conventional CMOS NAND gates, conventional CMOS transmission pass gates, etc.), which are not described in detail herein.

The second CMOS region 115 may include a semiconductive structure (e.g., a semiconductive wafer), or a base semiconductive material on a support structure or construction upon which additional materials and structures of the first microelectronic device structure 110 are formed, as described above with reference to the first CMOS region 105. In some embodiments, the second CMOS region 115 comprises a silicon wafer.

The transistor structures 175 may be formed within a second base structure 185 that may be substantially the same as the first base structure 174. In some embodiments, the second base structure 185 comprises silicon and may include conductively-doped regions 187 and undoped regions.

The transistor structures 175 may be substantially the same as the transistor structures 170 except that, in some embodiments, the orientation of the transistor structures 175 is vertically (e.g., in the Z-direction) flipped relative to the orientation of the transistor structures 170. In some embodiments, conductive interconnect structures 180 may be electrically connected to the conductively-doped regions 187 and may electrically connect the conductively-doped regions 176 and the gate structures 178 to one or more routing structures 189 and pad structures 190. The pad structures 190 may be in electrical communication with the routing structures 189 by means of conductive interconnect structures 191.

The routing structures 189, the pad structures 190, and the conductive interconnect structures 191 may individually be formed of and include conductive material. In some embodiments, the routing structures 189, the pad structures 190, and the conductive interconnect structures 191 individually comprise tungsten. In other embodiments, the routing structures 189, the pad structures 190, and the conductive interconnect structures 191 individually comprise copper.

With reference to FIG. 1F, the second conductive pillars 126 may vertically (e.g., in the Z-direction) extend through levels of the insulative structure 104. The second conductive pillars 126 may electrically connect the first conductive lines 122 to the sub word line driver 154, as described above with reference to FIG. 1A through FIG. 1C. In some embodiments, the second conductive pillars 126 are in electrical communication with routing structures 147 for electrically coupling the second conductive pillars 126 to the sub word line driver 154. In some embodiments, a conductive interconnect structure 149 may electrically connect a routing structure 147 to a pad structure 190 coupled to a transistor structure 175.

With combined reference to FIG. 1E and FIG. 1F, a back end of line (BEOL) structure 195 may vertically (e.g., in the Z-direction) overlie the second microelectronic device structure 150. The back end of line structure 195 may include, for example, second conductive pad structures 198, one or more conductive line structures 192, one or more third conductive pad structures 193, and one or more conductive landing pad structures 194. The second conductive pad structures 198 may in electrical communication with the conductive line structures 192 by means of conductive interconnect structures 197. Each of the second conductive pad structures 198, conductive line structures 192, the third conductive pad structures 193, and the conductive interconnect structures 197 may be located within an insulative material 196, such as, for example, silicon dioxide.

At least some of the second conductive pad structures 198 may be in electrical communication with one or more components of the first microelectronic device structure 110 or the second microelectronic device structure 150. By way of non-limiting example, the second conductive pad structures 198 may be in electrical communication with one or more of the second conductive pillars 126, the first conductive interconnect structures 132, the second conductive interconnect structures 134, the third conductive interconnect structures 140, and/or other structures.

Each of the second conductive pad structures 198, conductive line structures 192, third conductive pad structures 193, conductive landing pad structures 194, and conductive interconnect structures 197 may individually be formed of and include conductive material. In some embodiments, the conductive pad structures and the conductive interconnect structures 197 are formed of and include tungsten. In some embodiments, the conductive line structures 192 and the third conductive pad structures 193 are formed of and include copper. In some embodiments, the conductive landing pad structures 194 are formed of and include aluminum.

Accordingly, the microelectronic device 100 may include the first microelectronic device structure 110 including the first CMOS region 105 and the second microelectronic device structure 150 including the second CMOS region 115. Circuitry of the first CMOS region 105 may be electrically coupled to circuitry of the second CMOS region 115 by way of interconnects, such as the first conductive interconnect structure 132, the second conductive interconnect structures 134, and the third conductive interconnect structures 140. The second microelectronic device structure 150 may be attached to the first microelectronic device structure 110 by, for example, oxide-to-oxide bonding between the second insulative material 177 of the first microelectronic device structure 110 and the third insulative material 181 of the second microelectronic device structure 150.

The location of the devices (e.g., control logic devices) and circuitry within the second CMOS region 115 relative to the devices (e.g., control logic devices) and circuitry of the first CMOS region 105 and the array region 112 may facilitate an increase in the density of the memory cells 114 of the array region 112. In some embodiments, positioning the sub word line drivers 154 within the second CMOS region 115 and directly vertically above the stair step structures 125 facilitates forming electrical connections between the steps 124 (and the first conductive lines 122) and the sub word line driver 154 having a relatively shorter dimensions. For example, the second conductive pillars 126 may connect the sub word line driver 154 to the steps 124 of the stair step structures 125 without (e.g., without substantially) having to route in the lateral direction (e.g., in the X-direction, in the Y-direction). The relatively shorter distance of the electrical connection between the sub word line driver 154 and the steps 124 (e.g., the second conductive pillars 126) facilitates an improved data transmission path and an increased operating speed of the microelectronic device 100.

In some embodiments, forming the first CMOS region 105 to include control logic devices that are different than the control logic devices of the second CMOS region 115 may facilitate improved operation of the microelectronic device 100. For example, forming the first CMOS region 105 to include the sense amplifier regions 130 may facilitate provision of area for control logic devices that are electrically connected to each other to be located directly laterally neighboring (e.g., in the X-direction, in the Y-direction) one another. Positioning such control logic devices to directly laterally neighbor one another facilitates improved data transmission speeds between control logic devices configured to send and receive signals from one another. By way of non-limiting example, positioning the column select devices 152 and the column decoders 155 to directly laterally neighbor one another within the second CMOS region 115 facilitates improved data transmission speeds between the column select devices 152 and the column decoders 155. As another non-limiting example, forming the second CMOS region 115 to include the row decoders 158 directly laterally neighboring the main word line drivers 156, and the main word line drivers 156 directly laterally neighboring the sub word line drivers 154 facilitates improved data transmission speeds between the row decoders 158 and the main word line drivers 156 and between the main word line drivers 156 and the sub word line drivers 154.

In some embodiments, the microelectronic device 100 is be formed by forming the first microelectronic device structure 110 and the second microelectronic device structure 150 separately. After forming each of the first microelectronic device structure 110 and the second microelectronic device structure 150, the first microelectronic device structure 110 may be attached (e.g., bonded) to the second microelectronic device structure 150. By way of non-limiting example, in some embodiments, the second insulative material 177 of the first microelectronic device structure 110 may be bonded to the third insulative material 181 of the second microelectronic device structure 150 by oxide-to-oxide bonding, as described above. In some such embodiments, the back end of line structure 195 is formed on the second microelectronic device structure 150 after bonding the second microelectronic device structure 150 to the first microelectronic device structure 110.

In other embodiments, the microelectronic device 100 is formed by, for example, forming the first microelectronic device structure 110 and attaching the first microelectronic device structure 110 to a structure (e.g., a wafer) from which the second microelectronic device structure 150 will be formed. For example, a wafer from which the second microelectronic device structure 150 is to be formed may be bonded to the first microelectronic device structure 110 and a portion of the wafer may be detached (e.g., cleaved), leaving a portion of the wafer from which the second microelectronic device structure 150 will be formed attached to the first microelectronic device structure 110. After the wafer is attached to the first microelectronic device structure 110, the second microelectronic device structure 150 and the back end of line structure 195 may be formed to form the microelectronic device 100.

Thus, in accordance with some embodiments of the disclosure, a microelectronic device comprises a first control logic region comprising first control logic devices and a memory array region vertically overlying the first control logic region. The memory array region comprises capacitors, access devices laterally neighboring and in electrical communication with the capacitors, conductive lines operatively associated with the access devices and extending in a lateral direction, and first conductive pillars operatively associated with the access devices and vertically extending through the memory array region. The microelectronic device further comprises a second control logic region comprising second control logic devices vertically overlying the memory array region.

Furthermore, in accordance with additional embodiments of the disclosure, a microelectronic device comprises a memory array region comprising vertical stacks of memory cells, first conductive lines laterally extending through the vertical stacks of memory cells, each first conductive line of the first conductive lines associated with a level of the memory cells of the vertical stacks of memory cells, second conductive lines vertically extending through the vertical stacks of memory cells, each second conductive line of the second conductive lines vertically extending through access devices of the vertical stacks of memory cells, a first complementary metal oxide semiconductor region vertically underlying the memory array region and comprising control logic devices for effectuating at least a portion of control operations for the vertical stacks of memory cells, and a second complementary metal oxide semiconductor region vertically overlying the memory array region, the second complementary metal oxide semiconductor region comprising different control logic devices than the first complementary metal oxide semiconductor region.

Thus, in accordance with yet other embodiments of the disclosure a method of forming a microelectronic device comprises forming a first microelectronic device structure and forming a second microelectronic device structure. The first microelectronic device structure comprises a memory array region comprising vertical stacks of memory cells, word lines laterally extending through the memory array region and terminating at stair step structures proximate lateral boundaries of the memory array region, digit lines vertically extending through access devices of the vertical stacks of memory cells, and at least one sense amplifier vertically underlying the memory array region. The second microelectronic device structure comprises at least one sub word line driver, and control logic circuitry configured for effectuating control operations for the vertical stacks of memory cells. The method further comprises electrically coupling the at least one sub word line driver with the word lines.

Thus, in accordance with further embodiments of the disclosure, a memory device comprises a first region comprising first control logic devices comprising sense amplifier subregions, and a second region comprising second control logic devices having different configurations than the first control logic devices. The second control logic devices comprise sub word line drivers, and column select devices. The memory device further comprises a memory array region vertically interposed between the first region and the second region. The memory array region comprises vertical stacks of memory cells, each vertical stack of memory cells comprising levels of access devices operably coupled to levels of capacitors, conductive lines laterally extending through the vertical stacks of memory cells, and conductive pillars vertically extending through the levels of the access devices. The memory device further comprises conductive interconnect structures vertically extending between and electrically coupling the sense amplifier regions to the column select devices.

Figure 2:
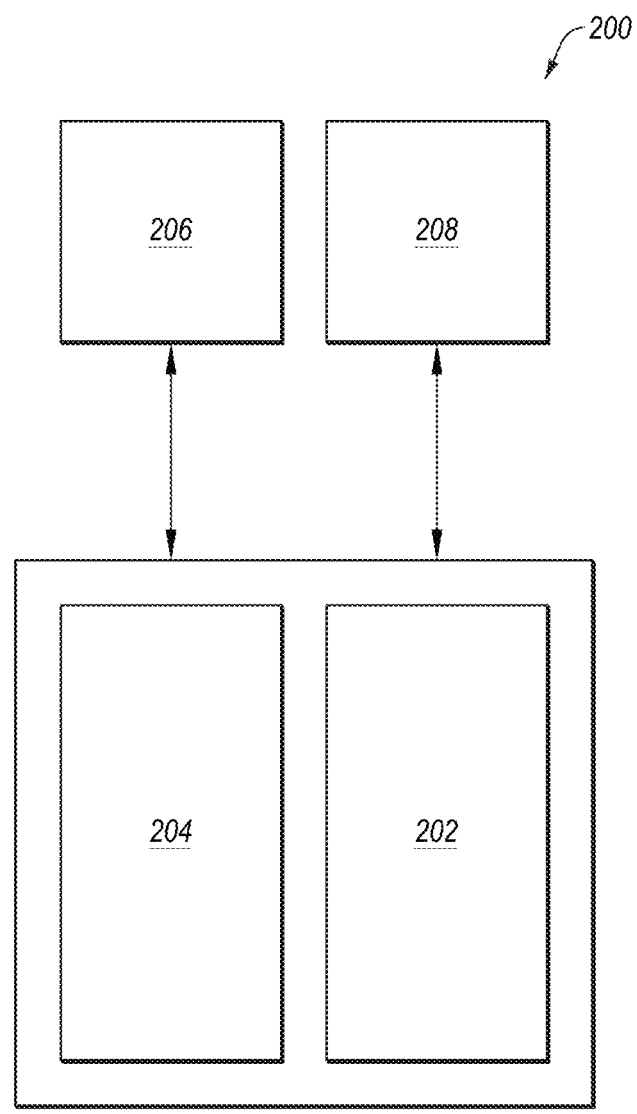
FIG. 2 is a schematic block diagram of an electronic system, in accordance with an embodiment of the disclosure.

Structures, assemblies, and devices in accordance with embodiments of the disclosure may be used in embodiments of electronic systems of the disclosure. For example, FIG. 2 is a block diagram of an illustrative electronic system 200 according to embodiments of disclosure. The electronic system 200 may comprise, for example, a computer or computer hardware component, a server or other networking hardware component, a cellular telephone, a digital camera, a personal digital assistant (PDA), portable media (e.g., music) player, a Wi-Fi or cellular-enabled tablet such as, for example, an iPad® or SURFACE® tablet, an electronic book, a navigation device, etc. The electronic system 200 includes at least one memory device 202. The memory device 202 may comprise, for example, an embodiment of one or more of a microelectronic device structure and a microelectronic device previously described herein with reference to FIG. 1A through FIG. 1F. The electronic system 200 may further include at least one electronic signal processor device 204 (often referred to as a "microprocessor"). The electronic signal processor device 204 may, optionally, include an embodiment of one or more of a microelectronic device structure and a microelectronic device previously described herein with reference to FIG. 1A through FIG. 1F. While the memory device 202 and the electronic signal processor device 204 are depicted as two (2) separate devices in FIG. 2, in additional embodiments, a single (e.g., only one) memory/processor device having the functionalities of the memory device 202 and the electronic signal processor device 204 is included in the electronic system 200. In such embodiments, the memory/processor device may include one or more of a microelectronic device structure and a microelectronic device previously described herein with reference to FIG. 1A through FIG. 1F. The electronic system 200 may further include one or more input devices 206 for inputting information into the electronic system 200 by a user, such as, for example, a mouse or other pointing device, a keyboard, a touchpad, a button, or a control panel. The electronic system 200 may further include one or more output devices 208 for outputting information (e.g., visual or audio output) to a user such as, for example, one or more of a monitor, a display, a printer, an audio output jack, and a speaker. In some embodiments, the input device 206 and the output device 208 may comprise a single touchscreen device that can be used both to input information to the electronic system 200 and to output visual information to a user. The input device 206 and the output device 208 may communicate electrically with one or more of the memory device 202 and the electronic signal processor device 204.

Thus, in accordance with embodiments of the disclosure, an electronic system comprises an input device, an output device, a processor device operably coupled to the input device and the output device, and a memory device operably coupled to the processor device. The memory device comprises a first die and a second die. The first die comprises a memory array region comprising a vertical stack of capacitor structures, each capacitor structure operably coupled to an access device, word lines laterally extending through the memory array region, each word line configured to be operably coupled to at least one access device, at least one stair step structure including vertically spaced steps, each of the word lines individually laterally terminating at one of the vertically spaced steps, digit lines vertically extending through the memory array region, each of the digit lines vertically extending through more than one access device, and control logic circuits vertically underlying the memory array region and configured to effectuate at least some control operations of the memory array region. The second die comprises sub word line drivers directly vertically overlying the at least one stair step structure, and at least one column decoder in electrical communication with at least some of the control logic circuits of the first die.

The methods, structures, assemblies, devices, and systems of the disclosure advantageously facilitate one or more of improved performance, reliability, durability, increased miniaturization of components, improved pattern quality, and greater packaging density as compared to conventional methods, conventional structures, conventional assemblies, conventional devices, and conventional systems. The methods, structures, and assemblies of the disclosure may substantially alleviate problems related to the formation and processing of conventional microelectronic devices, such as undesirable feature damage (e.g., corrosion damage), deformations (e.g., warping, bowing, dishing, bending), and performance limitations (e.g., speed limitations, data transfer limitations, power consumption limitations).

While certain illustrative embodiments have been described in connection with the figures, those of ordinary skill in the art will recognize and appreciate that embodiments encompassed by the disclosure are not limited to those embodiments explicitly shown and described herein. Rather, many additions, deletions, and modifications to the embodiments described herein may be made without departing from the scope of embodiments encompassed by the disclosure, such as those hereinafter claimed, including legal equivalents. In addition, features from one disclosed embodiment may be combined with features of another disclosed embodiment while still being encompassed within the scope of the disclosure.

What is claimed is:

1. A microelectronic device, comprising:
   a memory array region comprising vertical stacks of memory cells;
   conductive lines laterally extending through the vertical stacks of memory cells, each conductive line of the conductive lines associated with a level of the memory cells of the vertical stacks of memory cells;

conductive pillars vertically extending through the vertical stacks of memory cells, each conductive pillar of the conductive pillars vertically extending through access devices of the vertical stacks of memory cells;

a first complementary metal oxide semiconductor region vertically underlying the memory array region and comprising control logic devices for effectuating at least a portion of control operations for the vertical stacks of memory cells; and a second complementary metal oxide semiconductor region vertically overlying the memory array region, the second complementary metal oxide semiconductor region comprising different control logic devices than the first complementary metal oxide semiconductor region.

2. The microelectronic device of claim 1, wherein the second complementary metal oxide semiconductor region comprises at least one sub word line driver.

3. The microelectronic device of claim 2, wherein the at least one sub word line driver directly vertically overlies a stair step structure comprising steps, each step in electrical communication with a conductive line of the conductive lines.

4. The microelectronic device of claim 2, further comprising a main word line driver laterally neighboring the at least one sub word line driver, the at least one sub word line driver in electrical communication with the main word line driver.

5. The microelectronic device of claim 4, wherein the at least one sub word line driver has a larger cross-sectional area than the main word line driver.

6. The microelectronic device of claim 1, further comprising a sense amplifier driver region within the second complementary metal oxide semiconductor region and within lateral boundaries of the memory array region.

7. The microelectronic device of claim 1, wherein the first complementary metal oxide semiconductor region comprises sense amplifier regions therein.

8. The microelectronic device of claim 7, further comprising a conductive interconnect structure electrically coupled to one of the sense amplifier regions of the first complementary metal oxide semiconductor region and a column select device of the second complementary metal oxide semiconductor region.

9. The microelectronic device of claim 8, wherein the column select device directly vertically overlies the sense amplifier regions.

10. The microelectronic device of claim 8, further comprising an additional conductive interconnect structure in electrical communication with one of the sense amplifier regions of the first complementary metal oxide semiconductor region and a sense amplifier driver region of the second complementary metal oxide semiconductor region.

11. The microelectronic device of claim 1, wherein the vertical stacks of memory cells comprise vertical stacks of capacitors.

12. A microelectronic device, comprising:
an array region comprising a stack structure including levels of dynamic random access memory (DRAM) cells vertically stacked relative to one another, the DRAM cells of each of the levels comprising:
access devices respectively comprising:
source material;
drain material;
channel material horizontally interposed between the source material and the drain material in a first direction; and
gate electrode material vertically overlying the channel material and horizontally extending in a second direction orthogonal to the first direction; and
capacitors horizontally neighboring the access devices in the first direction, the capacitors respectively vertically overlapping and coupled to the drain material of one of the access devices;
conductive pillars vertically extending completely through the levels of DRAM cells, the conductive pillars coupled to the source material of respective ones of the access devices of the DRAM cells within the levels of DRAM cells;
a control logic region vertically underlying the array region and comprising control logic circuitry configured to effectuate control operations for the levels of DRAM cells; and
an additional control logic region vertically overlying the array region and comprising additional control logic circuitry configured to effectuate additional control operations for the levels of DRAM cells.

\* \* \* \* \*

UNITED STATES PATENT AND TRADEMARK OFFICE
CERTIFICATE OF CORRECTION

Page 1 of 1

PATENT NO. : 12,341,134 B2
APPLICATION NO. : 18/478821
DATED : June 24, 2025
INVENTOR(S) : Fatma Arzum Simsek-Ege and Yuan He It is certified that error appears in the above-identified patent and that said Letters Patent is hereby corrected as shown below:

In the Specification

| | | |
|---|---|---|
| Column 4, | Line 44, | change "hafnium (H), tantalum" to --hafnium (Hf), tantalum-- |
| Column 15, | Line 6, | change "more muting structures" to --more routing structures-- |
| Column 15, | Line 18, | change "the muting structures" to --the routing structures-- |
| Column 18, | Line 55, | change "with a muting structure" to --with a routing structures-- |

Signed and Sealed this
Thirtieth Day of September, 2025

John A. Squires
*Director of the United States Patent and Trademark Office*